(12) United States Patent
Adams et al.

(10) Patent No.: US 6,657,886 B1
(45) Date of Patent: Dec. 2, 2003

(54) SPLIT LOCAL AND CONTINUOUS BITLINE FOR FAST DOMINO READ SRAM

(75) Inventors: Chad Allen Adams, Byron, MN (US); Anthony Gus Aipperspach, Rochester, MN (US); Todd Alan Christensen, Rochester, MN (US); Peter Thomas Freiburger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/140,549

(22) Filed: May 7, 2002

(51) Int. Cl.[7] ............................................... G11C 11/40
(52) U.S. Cl. .................. 365/154; 365/156; 365/189.05
(58) Field of Search ................................. 365/154, 156, 365/189.05, 203, 189.01

(56) References Cited

U.S. PATENT DOCUMENTS 5,850,367 A  * 12/1998 Wada et al. ........... 365/230.03
6,366,504 B1  * 4/2002 Masgonty et al. ...... 365/189.08

* cited by examiner

Primary Examiner—Son Mai
(74) Attorney, Agent, or Firm—Joan Pennington

(57) ABSTRACT

A high performance domino static random access memory (SRAM) is provided. The domino SRAM includes a plurality of local cell groups. Each of the plurality of local cell groups includes a plurality of SRAM cells and a local true bitline coupled to each of the plurality of SRAM cells of each local cell group. A continuous complement bitline is coupled to each of the plurality of local cell groups and is coupled to each of the plurality of SRAM cells of each local cell group. For a write to the SRAM cell complement node, only driving the continuous complement bitline is required. The domino SRAM reduces the number of required wires and required transistors as compared to prior art domino SRAM and thus the area needed and power consumption are reduced for the domino SRAM.

11 Claims, 4 Drawing Sheets

SPLIT LOCAL AND CONTINUOUS BITLINE FOR FAST DOMINO READ SRAM

FIELD OF THE INVENTION

The present invention relates generally to static random access memories, and more particularly to a high performance domino static random access memory (SRAM) with a split local bitline and a continuous bitline.

DESCRIPTION OF THE RELATED ART

High performance domino SRAMs are known in the art. For example, U.S. Pat. No. 5,668,761 discloses a high performance domino SRAM.

FIGS. 1A and 1B illustrates a high performance, low power domino SRAM design including multiple local cell groups. As shown in FIG. 1A, each cell group includes multiple SRAM cells 1-N and local true and complement bitlines LBLT and LBLC. Each SRAM cell includes a pair of inverters that operate together in a loop to store true and complement (T and C) data. The local true bitline LBLT and the local complement bitline LBLC are connected to each SRAM cell by a pair of wordline N-channel field effect transistor (NFETs) to respective true and complement sides of the inverters. A WORDLINE provides the gate input to wordline NFETs. A particular WORDLINE is activated, turning on respective wordline NFETs to perform a read or write operation.

As shown in FIG. 1B, the prior art domino SRAM includes multiple local cell groups 1-M. Associated with each local cell group are precharge true and complement circuits coupled to the respective local true and complement bitlines LBLT and LBLC, write true and write complement circuits, and a local evaluate circuit. Each of the local evaluate circuits is coupled to a global bitline labeled 2ND STAGE EVAL and a second stage inverter that provides output data or is coupled to more stages. A write predriver circuit receiving input data and a write enable signal provides write true WRITE T and write complement WRITE C signals to the write true and write complement circuits of each local cell group.

A read occurs when a wordline is activated. Since true and complement (T and C) data is stored in the SRAM memory cell, either the precharged high true local bitline LBLT will be discharged if a zero was stored on the true side or the precharged high complement bitline LBLC will be discharged if a zero was stored on the complement side. The local bitline, LBLT or LBLC connected to the one side will remain in its high precharged state. If the true local bitline LBLT was discharged then the zero will propagate through one or more series of domino stages eventually to the output of the SRAM array. If the true local bitline was not discharged then no switching through the domino stages will occur and the precharged value will remain at the SRAM output.

To perform a write operation, the wordline is activated as in a read. Then either the write true WRITE T or write complement WRITE C signal is activated which pulls either the true or complement local bitline low via the respective write true circuit or write complement circuit while the other local bitline remains at its precharged level, thus updating the SRAM cell.

SRAM arrays are typically used for applications requiring high capacity. SRAM storage cells are typically designed for very high density to accommodate this high capacity. Often the feature sizes inside the SRAM cell are the densest allowed in a given technology. Therefore since the cell is designed to be small, little room exists to place wires within the pitch of the SRAM cell. It is not uncommon for there to be only room enough for two or three wiring tracks available over the SRAM cell in each X and Y direction. Since power and ground connections must also be made to each SRAM cell, this puts the number of wires available at a premium. Anything that can reduce the number of wires required will result in savings in area and power.

The prior art domino SRAM array typically has one wire for the wordline in the Y direction. A total of five wires are provided in the X direction including the true and complement local bitlines LBLT, LBLC, the global bitline, and the true and complement write lines, WRITE T and WRITE C.

Typically the SRAM cell width is not large enough to accommodate this number of wires on the same wiring level so that some of the wires must be moved up to higher wiring levels. A problem of such multiple level wiring arrangement is that other circuits on the chip are prevented from using those wiring areas.

A need exists for a high performance domino static random access memory (SRAM) that reduces the number of wires required. It is also desirable to provide a high performance domino static random access memory (SRAM) that minimizes power consumption and area requirements.

SUMMARY OF THE INVENTION

A principal object of the present invention is to provide an improved high performance domino static random access memory (SRAM). Other important objects of the present invention are to provide such improved high performance domino static random access memory (SRAM) substantially without negative effect and that overcome many of the disadvantages of prior art arrangements.

In brief, a high performance domino static random access memory (SRAM) is provided. The domino SRAM includes a plurality of local cell groups. Each of the plurality of local cell groups includes a plurality of SRAM cells and a local true bitline coupled to each of the plurality of SRAM cells of each local cell group. A continuous complement bitline is coupled to each of the plurality of local cell groups and is coupled to each of the plurality of SRAM cells of each local cell group.

In accordance with features of the invention, only driving the continuous complement bitline is required for a write to the SRAM cell complement node. The domino SRAM reduces the number of required wires and required transistors as compared to prior art domino SRAMs and thus the area needed and power consumption are reduced for the domino SRAM.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2A:
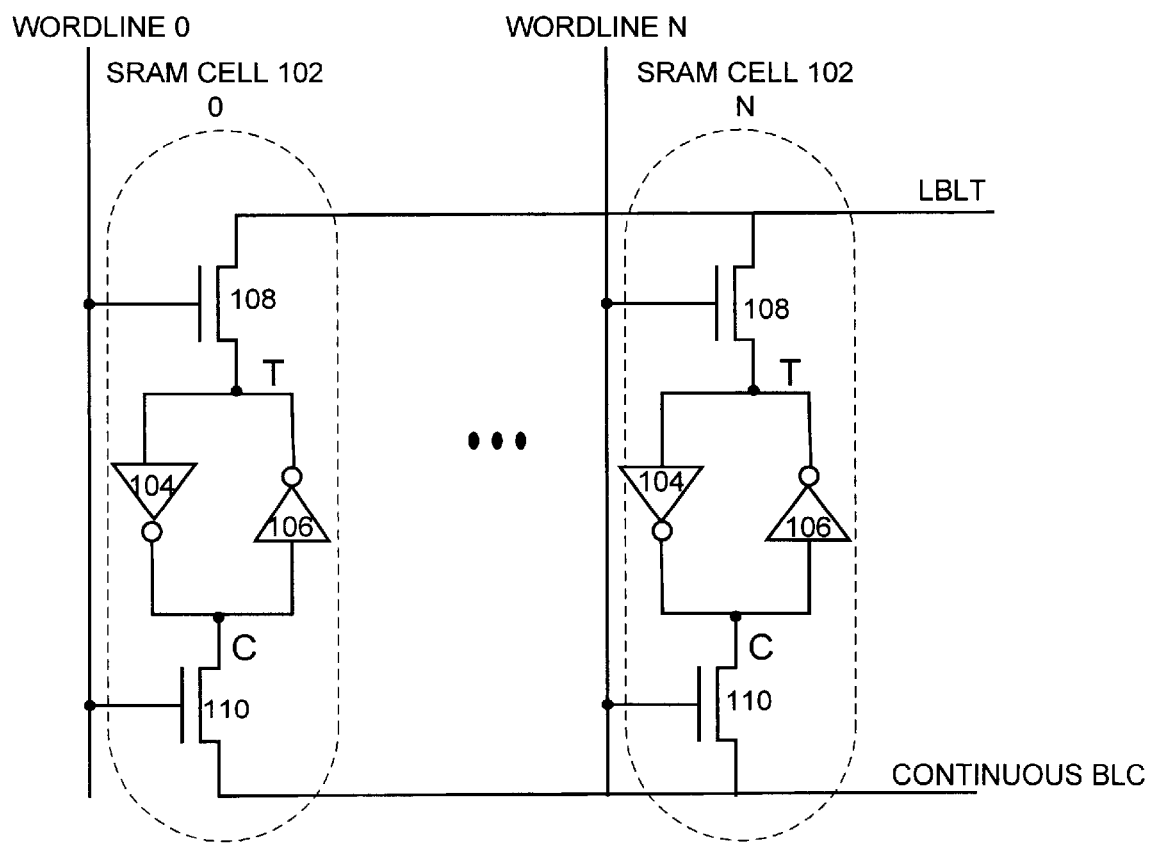
FIG. 2A is a schematic diagram representation of a local cell group in accordance with the preferred embodiment.
Figure 2B:
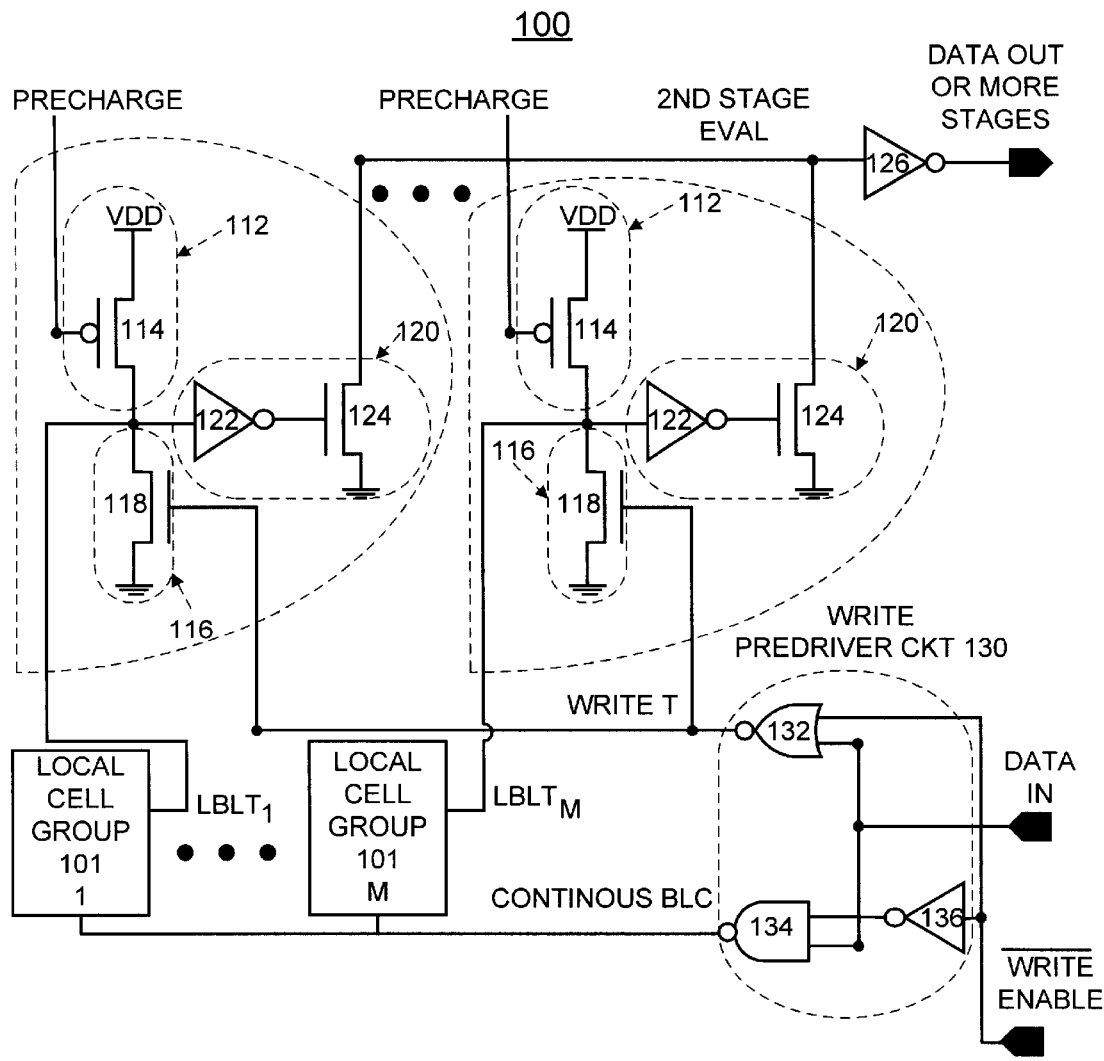
FIG. 2B is a schematic diagram representation of a high performance domino static random access memory (SRAM) including multiple local cell groups of FIG. 2A in accordance with the preferred embodiment.

Having reference now to the drawings, in FIG. 2A and 2B, there is shown an exemplary high performance domino static random access memory (SRAM) generally designated by the reference character 100. Domino SRAM 100 includes a plurality of local cell groups 101 1-M. A local cell group 101 including a plurality of SRAM cells 102 is illustrated in FIG. 2A. Each local cell group 101 includes a set number of SRAM cells, for example, 16 SRAM cells; and domino SRAM 100 can include, for example, 16 local cell groups 101 for a total of 256 SRAM cells.

Figure 1A:
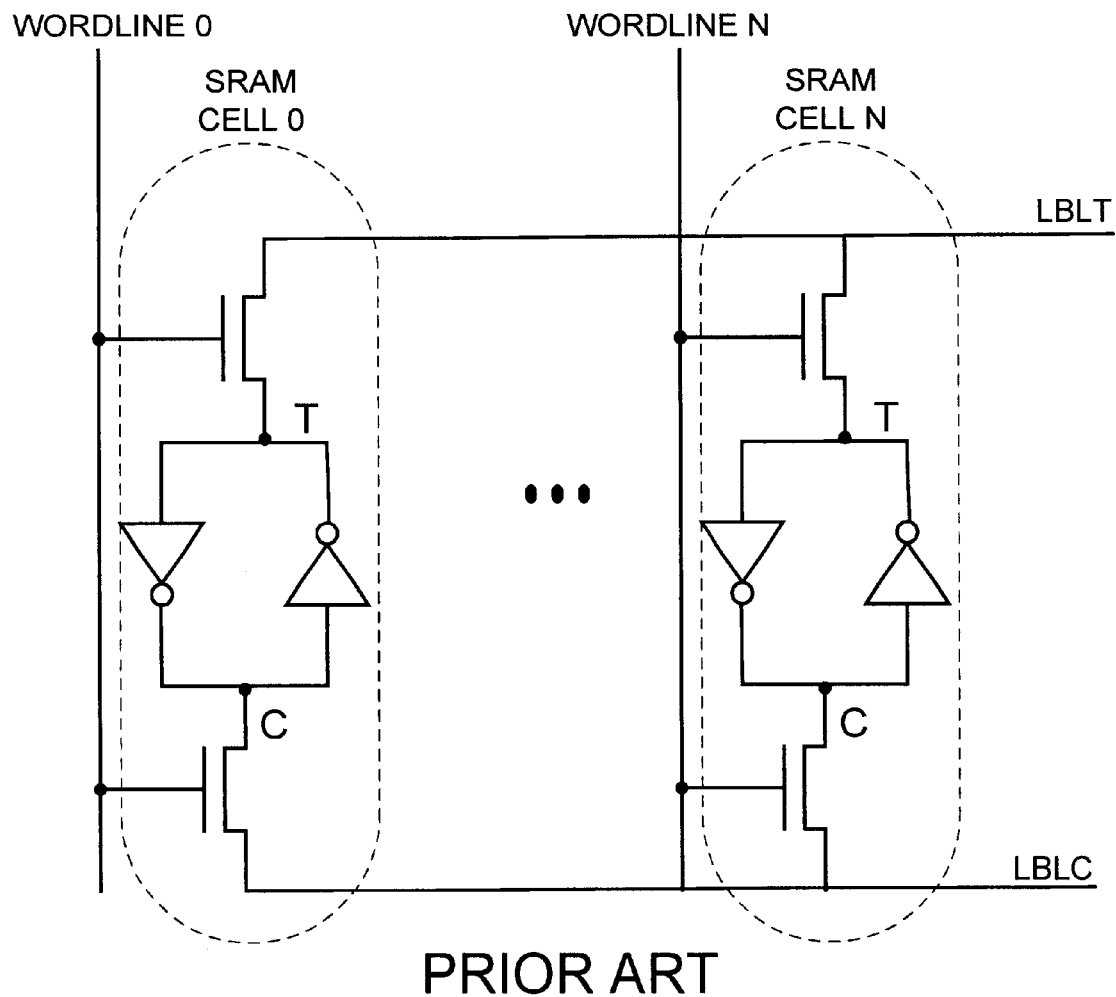
FIGS. 1A and B respectively illustrate a prior art local cell group and a prior art domino SRAM.

In accordance with features of the invention, domino SRAM 100 reduces the required number of wires as compared to prior art domino SRAM arrangements. Domino SRAM 100 replaces the multiple local complement bitlines LBLC for each local cell group of the prior art SRAM of FIGS. 1A and 1B with a continuous complement bitline labeled CONTINUOUS BLC. The continuous complement bitline CONTINUOUS BLC runs to each of the multiple local cell groups 101 1-M. The write complement wire WRITE C is no longer needed and the number of wires necessary for domino SRAM 100 is reduced by one. Domino SRAM 100 reduces of the number of required transistors and thus the area needed and power consumption are reduced for the domino SRAM 100.

It should be understood that a continuous true bitline with a split complement bitline could be used in accordance with the invention. It should be understood that the labels of true and complement domino of SRAM 100 in FIGS. 2A and 2B could be reversed.

Referring to FIG. 2A, each SRAM cell 102 includes a pair of inverters 104 and 106 having their input and output terminals cross-connected to each other. The pair of inverters 104 and 106 operate together to store true and complement (T and C) data. A pair of wordline N-channel field effect transistor (NFETs) 108 and 110 is connected to the true and complement sides respectively labeled T and C of the inverters 104 and 106. A respective WORDLINE provides the gate input to wordline NFETs 108, 110. A respective WORDLINE is activated, turning on wordline NFETs 108,110 to perform a read or write operation to the respective SRAM cell 102. A local true bitline LBLT is connected to NFET 108 of each SRAM cell 102 in the local cell group 101. The continuous complement bitline CONTINUOUS BLC is connected to NFET 110 of each SRAM cell 102 in each of the local cell groups 101.

Figure 1B:
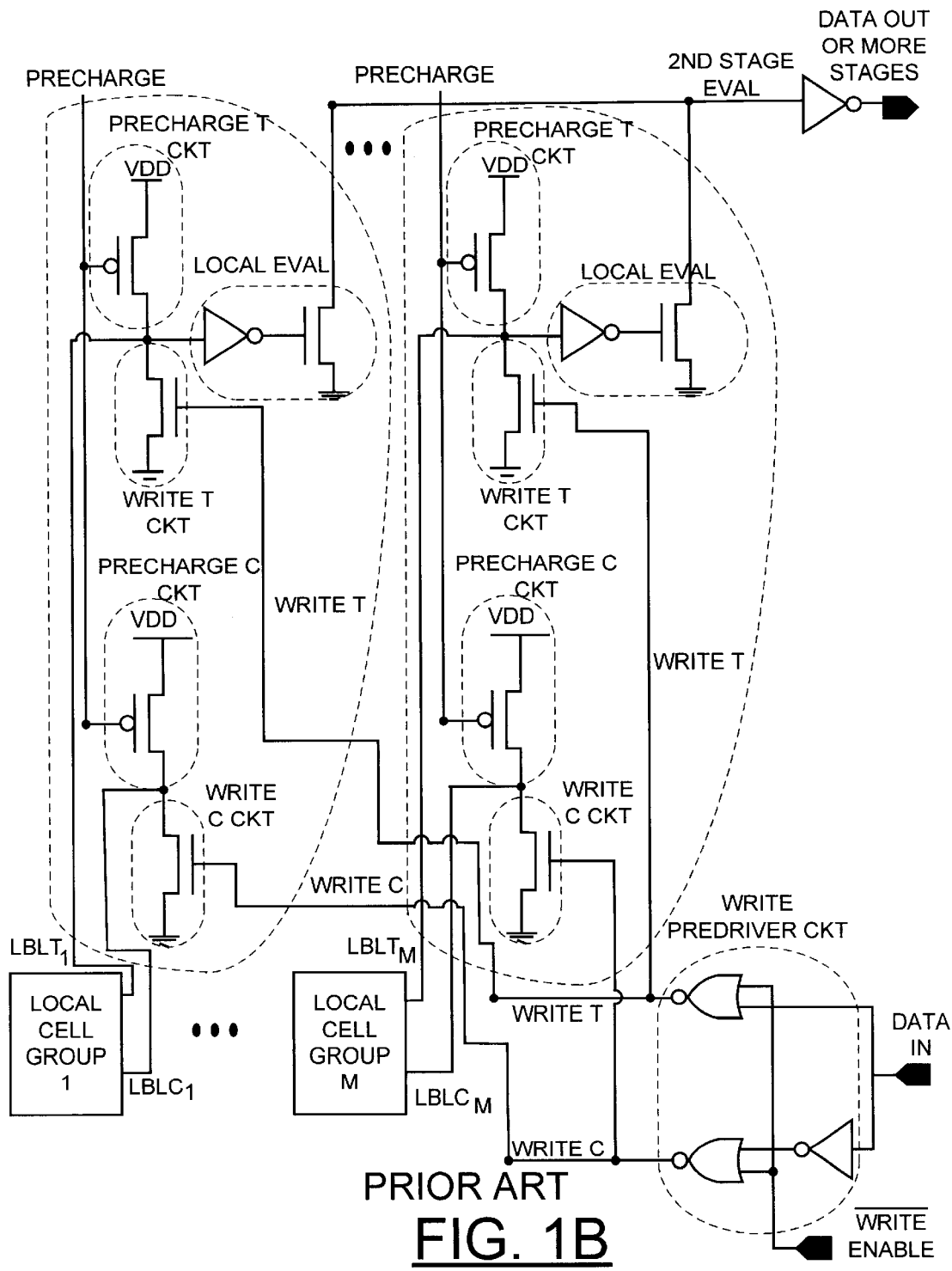

Referring to FIG. 2B, for each of the multiple local cell groups, domino SRAM 100 includes a precharge circuit 112 formed by a P-channel field effect transistor PFET 114 connected between a voltage supply rail VDD and each local true bitline LBLT. A PRECHARGE provides a gate input to the precharge PFET 114. During a precharge cycle, the node local true bitline LBLT is precharged with a voltage, and during an evaluation cycle, the node local true bitline LBLT can be discharged for evaluation. Domino SRAM 100 includes a write circuit 116 formed by an N-channel field effect transistor NFET 118 connected between the local true bitline LBLT and ground. WRITE T provides a gate input to the write NFET 118. The precharge and write complement circuits of the prior art domino SRAM of FIG. 1B are eliminated with the continuous complement bitline CONTINUOUS BLC of the preferred embodiment.

For each of the multiple local cell groups 101 1-M, domino SRAM 100 includes a local evaluate stage 120 including a first inverter 122 and an evaluate N-channel field effect transistor NFET 124. The first inverter 122 is coupled to the respective node local true bitline LBLT and provides a gate input to evaluate NFET 124. Each evaluate NFET 124 is coupled between ground and a global bitline labeled 2ND STAGE EVAL and an input to a second inverter 126. Second inverter 126 provides output data or is coupled to more stages.

Domino SRAM 100 includes a write predriver circuit 130 arranged to accommodate the change in phase necessary on the continuous complement bitline CONTINUOUS BLC. The write predriver circuit 130 is formed by a write true two-input NOR gate 132, a write complement two-input NAND gate 134 and an inverter 136. An inverted WRITE ENABLE input is coupled to a first input of the NOR gate 132. The inverted WRITE ENABLE input is inverted by inverter 136 is coupled to a first input of the NAND gate 134. A data input DATA IN is coupled to the second input of the NOR gate 132 and NAND gate 134. NOR gate 132 provides the WRITE T input applied to gate of write NFET 118 of the write circuit 116. NAND gate 134 drives the continuous complement bitline CONTINUOUS BLC coupled to each local cell group 101 1-M.

In Domino SRAM 100 only driving the continuous complement bitline CONTINUOUS BLC is necessary; where in the prior art, a separate local complement bitline LBLC together with a write complement WRITE C line and write complement circuit was required for each local cell group. SRAM 100 with the continuous complement bitline CONTINUOUS BLC results in area reduction resulting in shorter wires in the bitline direction and thus reduces delay and consumes less power.

In operation, a read occurs when a selected WORDLINE is activated for a particular SRAM cell 102. A read of the SRAM cell 102 occurs as before except the continuous complement bitline CONTINUOUS BLC is held high in the illustrated implementation. It should be understood that the continuous complement bitline CONTINUOUS BLC could be allowed to float discharging from a zero in the complement node C of the SRAM cell 102. Since the read is from the true side T of the SRAM cell 102, either mode will not affect the read. During the read if a zero was stored on the true side T, the precharged high true local bitline LBLT will be discharged. The continuous complement bitline CONTINUOUS BLC connected to the one side will remain in its high state. If a zero was stored on the complement side C, the CONTINUOUS BLC will be held to VDD with the illustrated write predriver circuit 130 as shown in FIG. 2B. The local true bitline LBLT connected to the one side will remain in its high precharged state.

If the true local bitline LBLT was discharged then the zero will propagate through one or more series of domino stages eventually to the output of the SRAM array. If the true local bitline was not discharged then no switching through the domino stages will occur and the precharged value will remain at the SRAM output.

During a write, a selected WORDLINE is activated for a particular SRAM cell 102. If a zero is to be written to the complement node C of the SRAM cell 102, then the continuous complement bitline CONTINUOUS BLC is pulled to zero while the true local bitline LBLT is left precharged. If a zero is to be written to the true node T of the cell 102, then the write true line WRITE T is activated, turning on the write NFET 118 and pulling the true local bitline LBLT to zero and the continuous bitline is left high.

It should be understood that the present invention is not limited to the illustrated embodiment. For example, the illustrated implementations of the precharge circuit 112, write circuit 114, local evaluate circuit 120 and write pre-driver circuit 130 are exemplary implementations. Alternative implementations for each of these circuits could be used.

While the present invention has been described with reference to the details of the embodiments of the invention shown in the drawing, these details are not intended to limit the scope of the invention as claimed in the appended claims.

What is claimed is:

1. A domino static random access memory (SRAM) comprising:
   a plurality of local cell groups;
   each of said plurality of local cell groups including a plurality of SRAM cells and a local true bitline coupled to each of said plurality of SRAM cells,
   a continuous complement bitline coupled to each of said plurality of local cell groups; said continuous complement bitline coupled to said plurality of SRAM cells of each local cell group;
   a write circuit coupled to said local true bitline of each local cell group and coupled to said local continuous complement bitline; said write circuit including a write true driver, a write complement driver and an inverter; a data input is applied to said write true driver and said write complement driver; a write enable signal is applied to said write true driver and said write enable signal inverted by said inverter and said inverted write enable signal is applied to said write complement driver.

2. A domino static random access memory (SRAM) as recited in claim 1 includes a precharge circuit coupled to said local true bitline of each local cell group.

3. A domino static random access memory (SRAM) as recited in claim 2 includes a local evaluate circuit coupled to said local true bitline of each local cell group.

4. A domino static random access memory (SRAM) as recited in claim 1 wherein said write circuit receiving said write enable signal and said data input and providing a write true signal and a write complement signal.

5. A domino static random access memory (SRAM) as recited in claim 4 wherein said write true signal is applied to a write true line connected to a write field effect transistor coupled to said local true bitline; and said write complement signal applied to said local continuous complement bitline.

6. A domino static random access memory (SRAM) as recited in claim 1 wherein each said SRAM cell includes a pair of inverters; and a pair of wordline field effect transistors (FETs) coupled to said pair of inverters; a wordline signal coupled to said pair of wordline FETs; said wordline activated to perform a read or write operation of said SRAM cell.

7. A domino static random access memory (SRAM) comprising:
   a plurality of local cell groups;
   each of said plurality of local cell groups including a plurality of SRAM cells and a local true bitline coupled to each of said plurality of SRAM cells,
   a continuous complement bitline coupled to each of said plurality of local cell groups; said continuous complement bitline coupled to said plurality of SRAM cells of each local cell group;
   a write circuit coupled to said local true bitline of each local cell group and coupled to said local continuous complement bitline; said write circuit including a write true driver including a two-input NOR gate and a write complement driver including a two-input NAND.

8. A domino static random access memory (SRAM) comprising:
   a plurality of local cell groups;
   each of said plurality of local cell groups including a plurality of SRAM cells and a local true bitline coupled to each of said plurality of SRAM cells,
   a continuous complement bitline coupled to each of said plurality of local cell groups; said continuous complement bitline coupled to said plurality of SRAM cells of each of said plurality of local cell groups;
   a precharge circuit and a local evaluate circuit coupled to said local true bitline of each local cell group;
   a write circuit coupled to said local true bitline of each of said plurality of local cell groups and coupled to said local continuous complement bitline; said write circuit including a write true driver, a write complement driver and an inverter; a data input is applied to said write true driver and said write complement driver; a write enable signal is applied to said write true driver and said write enable signal inverted by said inverter and said inverted write enable signal is applied to said write complement driver.

9. A domino static random access memory (SRAM) as recited in claim 8 wherein each said SRAM cell includes a pair of inverters; and a pair of wordline field effect transistors (FETs) coupled to said pair of inverters; a wordline signal coupled to said pair of wordline FETs; said wordline activated to perform a read or write operation of said SRAM cell.

10. A domino static random access memory (SRAM) as recited in claim 8 wherein said write circuit receiving said write enable signal and said data input and providing a write true signal and a write complement signal.

11. A domino static random access memory (SRAM) as recited in claim 10 wherein said write true signal is applied to a write true line connected to a write field effect transistor coupled to said local true bitline; and said write complement signal applied to said local continuous complement bitline.

* * * * *